United States Patent
Iwanaga et al.

(10) Patent No.: US 7,141,355 B2
(45) Date of Patent: Nov. 28, 2006

(54) RADIATION-SENSITIVE RESIN COMPOSITION

(75) Inventors: Shin-ichiro Iwanaga, Tokyo (JP); Satoshi Iwamoto, Tokyo (JP); Tooru Kimura, Tokyo (JP); Hiroko Nishimura, Tokyo (JP); Koji Nishikawa, Tokyo (JP)

(73) Assignee: JSR Corporation, Tokyo (JP)

( * ) Notice: Subject to any disclaimer, the term of this patent is extended or adjusted under 35 U.S.C. 154(b) by 43 days.

(21) Appl. No.: 10/477,207

(22) PCT Filed: Dec. 13, 2002

(86) PCT No.: PCT/JP02/13072

§ 371 (c)(1),
(2), (4) Date: Nov. 18, 2003

(87) PCT Pub. No.: WO03/069410

PCT Pub. Date: Aug. 21, 2003

(65) Prior Publication Data

US 2004/0142280 A1     Jul. 22, 2004

(30) Foreign Application Priority Data

Feb. 18, 2002    (JP)  ............................. 2002-040301

(51) Int. Cl.
    *G03F 7/038*      (2006.01)
    *G03F 7/30*      (2006.01)

(52) U.S. Cl. .............. 430/287.1; 430/281.1; 430/288.1; 430/325

(58) Field of Classification Search ............ 430/280.1, 430/281.1, 288.1, 325, 287.1

See application file for complete search history.

(56) References Cited

U.S. PATENT DOCUMENTS 5,260,161 A * 11/1993 Matsumura et al. ........ 430/161
6,010,826 A * 1/2000 Abe et al. ................ 430/285.1
6,475,701 B1 * 11/2002 Ohno et al. .............. 430/280.1
2001/0044075 A1 * 11/2001 Nishimura et al. ....... 430/280.1

FOREIGN PATENT DOCUMENTS

| JP | 2000-39709 | 2/2000 |
| JP | 2001-228606 | 8/2001 |
| JP | 2002-14466 | 1/2002 |

\* cited by examiner

*Primary Examiner*—John S. Chu
(74) *Attorney, Agent, or Firm*—Oblon, Spivak, McClelland, Maier & Neustadt, P.C.

(57) ABSTRACT

A radiation-sensitive resin composition comprising (A) an alkali-soluble resin having an unsaturated group, (B) a compound having at least one ethylenically unsaturated double bond, and (C) a radiation-induced radical polymerization initiator, wherein:

the alkali-soluble resin having an unsaturated group (A) is obtained by reacting:
100 parts by weight of a copolymer comprising
1 to 40 wt % structural units derived from (a) a radically polymerizable compound having a carboxyl group;
1 to 50 wt % structural units having a phenolic hydroxyl group which are derived from (b-1) a radically polymerizable compound having a phenolic hydroxyl group or (b-2) a radically polymerizable compound having a functional group convertible into a phenolic hydroxyl group after the copolymerization, other structural units of said copolymer being derived from (c) another radically polymerizable compound;
with 0.1 to 20 parts by weight of (d) a radically polymerizable compound having an epoxy group.

The resin composition can form a radiation-sensitive film in a thickness greater than a deposit thickness and has a high resolution.

18 Claims, No Drawings

RADIATION-SENSITIVE RESIN COMPOSITION

FIELD OF THE INVENTION

The present invention relates to a radiation-sensitive resin composition, a metal pattern produced using the resin composition, and to a semiconductor device produced using the metal pattern. More particularly, the invention relates to a radiation-sensitive resin composition that is used in the formation of conductive parts of semiconductor devices when the semiconductor devices are produced by photofabrication. Further, the invention relates to a metal pattern and a semiconductor device obtained with use of the resin composition.

BACKGROUND OF THE INVENTION

Photofabrication is a general term for technologies to produce various precision parts by a series of steps in which:

a radiation-sensitive resin composition is applied onto a workpiece surface;

the resultant film is patterned by photolithography; and a chemical etching or an electroforming technique, mainly comprising an electrolytic etching or an electroplating, or their combination is carried out using the patterned film as a mask. This photofabrication is now a mainstream technology in the production of precision and fine parts.

In these years, the downsizing of electronic devices has accelerated a high integration and multi-layering of larger scale integration (LSI). To cope with such miniaturization, it is required that an LSI is mounted by a high pin count on a substrate to install in electronic devices. As such mounting technologies, bare chip mounting technologies, for example TAB mounting and flip-chip mounting, have more and more attracted attention. In the high density mounting, metal conductors formed by electrolytic plating have strict requirements. For example, one of the requirements is micropatterning of the metal conductors. Such metal patterns include bumps, called microelectrodes, and wirings that form conductive paths to electrodes. These metal patterns are required to be more microscopic with the trends toward the miniaturization, high pin counting and multi-layering of the package. For example, as the conventional projecting microelectrodes, gold bumps of about 20 μm high are arranged at a pitch of 40 μm or more with a distance of 8 to 10 μm between the bump edges. However, the bump pitches are required to be smaller because of higher performance and smaller size of electronic devices, and now the bump pitch of 25 μm is demanded.

Radiation-sensitive resin compositions used in the production of such microscopic metal patterns are required:

to form a radiation-sensitive film in a thickness greater than a deposit thickness necessary to from a bump, and to have a high resolution, for example, to have a resolution whereby the resultant film in a thickness of 20 μm or more can be patterned at 25 μm pitches in the production of gold bumps; or a resolution whereby the resultant film in a thickness of 10 μm can be patterned at 5 μm pitches in the formation of wirings.

Further, a patterned product which is obtained by curing the radiation-sensitive resin composition is used as a mask in electrolytic plating. Then, the patterned product is required to have a sufficient wettability by plating solutions and have a plating resistance. Further, it is necessary that patterned product can be easily and completely stripped by a stripping solution or the like without damaging the metal pattern given after plating.

However, the conventional radiation-sensitive resin compositions for metal pattern production hardly satisfy both the sufficient resolution and the other properties, such as plating resistance. When the resin composition has a poor resolution, a desired microscopic metal pattern is hardly formed and semiconductor devices with such metal patterns cannot be produced. Further, when the wettability is poor, a plating solution will not be supplied in a sufficient amount within the microscopic pattern of the cured product. Therefore, the metal pattern cannot be formed. Also, a poor plating resistance causes a short circuit between conductive parts, and the device may not operate properly.

OBJECT OF THE INVENTION

It is an object of the invention to provide a radiation-sensitive resin composition that can form a radiation-sensitive film in a thickness greater than a deposit thickness necessary to form a bump or the like and that has a high resolution.

The resin composition gives a cured product which is patterned and is used as a mask in electrolytic plating. The patterned product has a good wettability by plating solutions and a sufficient plating resistance. Further, the patterned product can be easily and completely stripped by a stripping solution or the like without damaging a metal pattern given after plating. The resin composition of the invention is a suitable material for the photofabrication.

DISCLOSURE OF THE INVENTION

The radiation-sensitive resin composition according to the invention comprises (A) an alkali-soluble resin having an unsaturated group, (B) a compound having at least one ethylenically unsaturated double bond, and (C) a radiation-induced radical polymerization initiator, wherein:

the alkali-soluble resin having an unsaturated group (A) is obtained by reacting:

100 parts by weight of a copolymer comprising 1 to 40 wt % structural units derived from (a) a radically polymerizable compound having a carboxyl group, and 1 to 50 wt % structural units having a phenolic hydroxyl group which are derived from (b-1) a radically polymerizable compound having a phenolic hydroxyl group or (b-2) a radically polymerizable compound having a functional group convertible into a phenolic hydroxyl group after the copolymerization, other structural units of said copolymer being derived from (c) a radically polymerizable compound other than the compounds (a), (b-1), (b-2) and following compound (d);

with 0.1 to 20 parts by weight of (d) a radically polymerizable compound having an epoxy group.

The production method of metal patterns according to the invention uses the above radiation-sensitive resin composition.

The production method of semiconductor devices according to the invention uses a metal pattern formed by the above method.

PREFERRED EMBODIMENTS OF THE INVENTION

The radiation-sensitive resin composition, the metal pattern formed using the same and semiconductor device produced using them will be described hereinafter.

The radiation-sensitive resin composition contains (A) an alkali soluble resin having an unsaturated group, (B) a compound having at least one ethylenically unsaturated double bond and (C) a radiation-induced radical polymerization initiator.

These components will be described individually hereinbelow.

Alkali Soluble Resin Having an Unsaturated Group (A)

The alkali soluble resin having an unsaturated group (A) (hereinafter referred to as the "alkali soluble resin (A)") is obtained by reacting:

a copolymer (hereinafter referred to as a "copolymer (I)") which comprises:
- (a) a radically polymerizable compound having a carboxyl group,
- (b-1) a radically polymerizable compound having a phenolic hydroxyl group and/or (b-2) a radically polymerizable compound having a functional group convertible into a phenolic hydroxyl group after the copolymerization, and
- another radically polymerizable compound (c);

with a radically polymerizable compound having an epoxy group (d).

(Radically Polymerizable Compound Having a Carboxyl Group (a))

Examples of the radically polymerizable compound having a carboxyl group (a) (hereinafter referred to as the "carboxyl compound (a)") include:

monocarboxylic acids, such as acrylic acid, methacrylic acid, crotonic acid, 2-succinoylethyl (meth)acrylate, 2-maleinoylethyl (meth)acrylate, 2-hexahydrophthaloylethyl (meth) acrylate, ω-carboxy-polycaprolactone monoacrylate (such as ARONIX M-5300 (trade name) commercially available from Toagosei Co., Ltd.), phthalic acid monohydroxyethyl acrylate (such as ARONIX M-5400 (trade name) commercially available from Toagosei Co., Ltd.), an acrylic dimer (such as ARONIX M-5600 (trade name) commercially available from Toagosei Co., Ltd.) and 2-hydroxy-3-phenoxypropyl acrylate (such as ARONIX M-5700 (trade name) commercially available from Toagosei Co., Ltd.); and (meth)acrylic acid derivatives having a carboxyl group derived from dicarboxylic acids, such as maleic acid, fumaric acid, citraconic acid, mesaconic acid and itaconic acid. These compounds may be used singly or in combination of two or more kinds.

Of the compounds listed above, acrylic acid, methacrylic acid, phthalic acid monohydroxyethyl acrylate and 2-hexahydrophthaloylethyl methacrylate are preferred.

The structural units derived from the carboxyl compound (a) (hereinafter referred to as the "structural units (a)") make up 1 to 40 wt %, preferably 5 to 30 wt %, and particularly preferably 10 to 20 wt % of the copolymer (I).

The alkali solubility of the alkali soluble resin (A) can be controlled by changing the content of the structural units (a). The alkali soluble resin (A) will be difficult to dissolve in an alkaline developer when the resin (A) has too low a content of the structural units (a); therefore, an undesired portion of a film may remain after developing and a sufficient resolution may not be obtained. When the content of the structural units (a) is too high, the alkali soluble resin (A) will have too high a solubility in an alkaline developer; therefore, a sufficient resolution may not be obtained due to dissolution and swelling of an exposed area by the developer.

(Radically Polymerizable Compound Having a Phenolic Hydroxyl Group (b-1) and Radically Polymerizable Compound Having a Functional Group Convertible Into a Phenolic Hydroxyl Group After the Copolymerization (b-2))

Examples of the radically polymerizable compound having a phenolic hydroxyl group (b-1) (hereinafter referred to as the "phenolic hydroxyl compound (b-1)") include p-hydroxystyrene, m-hydroxystyrene, o-hydroxystyrene, α-methyl-p-hydroxystyrene, α-methyl-m-hydroxystyrene, α-methyl-o-hydroxystyrene, 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone.

Of the compounds, p-hydroxystyrene and α-methyl-p-hydroxystyrene are preferred.

Examples of the radically polymerizable compound having a functional group convertible into a phenolic hydroxyl group after the copolymerization (hereinafter referred to as the "compound having a functional group (b-2)") include p-acetoxystyrene, α-methyl-p-acetoxystyrene, p-benzyloxystyrene, p-tert-butoxystyrene, p-tert-butoxycarbonyloxystyrene and p-tert-butyldimethylsiloxystyrene.

When the compound having a functional group (b-2) is used, the resultant copolymer is treated by an appropriate method, for example hydrolysis using hydrochloric acid or the like, to thereby readily convert the functional group into a phenolic hydroxyl group.

The structural units having a phenolic hydroxyl group (hereinafter referred to as the "structural units (b)") which are derived from the phenolic hydroxyl compound (b-1) or the compound having a functional group (b-2) make up 1 to 50 wt %, preferably 10 to 40 wt %, and particularly preferably 20 to 40 wt % of the copolymer (I). When the content of the structural units (b) is too low, a resolution of the radiation-sensitive resin composition and stripping properties of the resin film after plating may be lowered. When the structural units (b) content is too high, the molecular weight of the resultant copolymer will not be sufficiently high. As a result, it will be difficult to form the resin composition into a film in a thickness of 20 μm or more, and the resolution and plating resistance may be lowered.

(Another Radically Polymerizable Compound (c))

The radically polymerizable compound (c) is a different compound from the carboxyl compound (a), phenolic hydroxyl compound (b-1), compound having a functional group (b-2) and later-described radically polymerizable compound having an epoxy group (d). Examples of the radically polymerizable compound (c) include aryl (meth) acrylates, dicarboxylic acid diesters, polymerizable compounds having a nitrile group, polymerizable compounds having an amide linkage, vinyls, allyls, polymerizable compounds containing chlorine and conjugated diolefins. Specific examples are:

dicarboxylic acid diesters, such as diethyl maleate, diethyl fumarate and diethyl itaconate;

aryl (meth)acrylates, such as phenyl (meth)acrylate and benzyl (meth)acrylate;

aromatic vinyls, such as styrene, α-methylstyrene, m-methylstyrene, p-methylstyrene, vinyltoluene, p-methoxystyrene, p-hydroxystyrene, m-hydroxystyrene, o-hydroxystyrene, α-methyl-p-hydroxystyrene, α-methyl-m-hydroxystyrene and α-methyl-o-hydroxystyrene;

aromatic allyls, such as 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone;

polymerizable compounds having a nitrile group, such as acrylonitrile and methacrylonitrile;

polymerizable compounds having an amide linkage, such as acrylamide and methacrylamide;

vinyl esters of fatty acids, such as vinyl acetate;

polymerizable compounds containing chlorine, such as vinyl chloride and vinylidene chloride; and conjugated diolefins, such as 1,3-butadiene, isoprene and 1,4-dimethylbutadiene.

These compounds may be used singly or in combination of two or more kinds.

The structural units derived from the radically polymerizable compound (c) make up 1 to 80 wt %, and preferably 20 to 60 wt % of the copolymer (I).

By the use of the radically polymerizable compound (c), mechanical properties of the copolymer (I) are controlled appropriately. Also, the solubility of the copolymer (I) in alkaline aqueous solution can be controlled.

(Solvent)

Exemplary solvents for polymerization to use in the production of the copolymer (I) include:

alcohols, such as methanol, ethanol, ethylene glycol, diethylene glycol and propylene glycol;

cyclic ethers, such as tetrahydrofuran and dioxane;

alkyl ethers of polyvalent alcohols, such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether;

alkyl ether acetates of polyvalent alcohols, such as ethylene glycol ethyl ether acetate, diethylene glycol ethyl ether acetate, propylene glycol ethyl ether acetate and propylene glycol monomethyl ether acetate;

aromatic hydrocarbons, such as toluene and xylene;

ketones, such as acetone, methyl ethyl ketone, methyl isobutyl ketone, cyclohexanone, 4-hydroxy-4-methyl-2-pentanone and diacetone alcohol; and esters, such as ethyl acetate, butyl acetate, ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate and butyl acetate. Of these compounds, the cyclic ethers, alkyl ethers of polyvalent alcohols, alkyl ether acetates of polyvalent alcohols, ketones and esters are preferred.

(Catalyst)

The catalyst used in the production of the copolymer (I) can be a conventional radical polymerization initiator. Examples of such polymerization catalysts include:

azo compounds, such as 2,2'-azobisisobutyronitrile, 2,2'-azobis-(2,4-dimethylvaleronitrile) and 2,2'-azobis-(4-methoxy-2-dimethylvaleronitrile);

organic peroxides, such as benzoyl peroxide, lauroyl peroxide, tert-butyl peroxypivalate and 1,1'-bis-(tert-butylperoxy)cyclohexane; and hydrogen peroxide. The peroxides may be used in the radical polymerization as a redox initiator in combination with a reducing agent.

The copolymer (I) obtained as described above has a weight-average molecular weight (Mw) in terms of polystyrene of 1,000 to 100,000, preferably 5,000 to 50,000, and more preferably 10,000 to 30,000 according to a gel permeation chromatography.

(Radically Polymerizable Compound Having an Epoxy Group (d))

Examples of the radically polymerizable compound having an epoxy group (d) (hereinafter referred to as the "compound having an epoxy group (d)") include glycidyl (meth)acrylate, glycidyl α-ethyl (meth)acrylate, glycidyl α-n-propyl (meth)acrylate, glycidyl α-n-butyl (meth)acrylate, 3,4-epoxybutyl (meth)acrylate, 6,7-epoxyheptyl (meth)acrylate and cyclohexene oxide (meth)acrylate. Of these, glycidyl methacrylate, 6,7-epoxyheptyl methacrylate and 6,7-epoxybutyl α-ethyl acrylate are preferred.

(Preparation of the Alkali Soluble Resin (A))

The alkali soluble resin (A) can be obtained by reacting the compound having an epoxy group (d) to the carboxylic group of the copolymer in the presence of an ammonium catalyst, such as tetrabutylammonium bromide.

The copolymer (I) and the compound having an epoxy group (d) are used in the proportions such that 0.1 to 20 parts by weight, and preferably 1 to 15 parts by weight of the compound (d) react based on 100 parts by weight of the copolymer (I).

When the amount of the compound having an epoxy group (d) exceeds the upper limit, a microscopic pattern may not be obtained due to poor resolution and a cured product is hardly stripped after plating. When the amount of the compound (d) falls below the lower limit, a curability of a microscopic pattern may be insufficient and a good pattern configuration may not be obtained.

In the reaction between the carboxyl group of the copolymer (I) and the compound having an epoxy group (d), the same solvent as in the production of the copolymer (I) can be used. Accordingly, the above reaction may be carried out sequentially with the polymerization for the copolymer (I). In this case, the solution obtained in the copolymer production is cooled to a given temperature, and the compound having an epoxy group (d) and the catalyst are added to the reaction system to react the carboxyl group of the copolymer (I) with the epoxy group.

Compound Having at Least One Ethylenically Unsaturated Double Bond (B)

The compound having at least one ethylenically unsaturated double bond (B) (hereinafter referred to as the "ethylenically unsaturated compound (B)") is defined as having at least one ethylenically unsaturated group in the molecule and being liquid or solid at room temperature. Here, it is generally preferable to use a compound having the ethylenically unsaturated group of a (meth)acryloyl group, i.e. (meth)acrylate compound, or a compound having a vinyl group.

The (meth)acrylate compounds are categorized into monofunctional compounds and polyfunctional compounds, which may be both usable in the invention.

Exemplary monofunctional compounds as the ethylenically unsaturated compound (B) include 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)

acrylate, butyl (meth)acrylate, amyl (meth)acrylate, isobutyl (meth)acrylate, tert-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecylamyl (meth)acrylate, lauryl (meth)acrylate, octadecyl (meth)acrylate, stearyl (meth)acrylate, tetrahydrofurfuryl (meth)acrylate, butoxyethyl (meth)acrylate, ethoxy diethylene glycol (meth)acrylate, benzyl (meth)acrylate, cyclohexyl (meth) acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, phenoxypolyethylene glycol (meth)acrylate, phenoxypolypropylene glycol (meth) acrylate, ethoxyethyl (meth)acrylate, methoxypolypropylene glycol (meth)acrylate, dicyclopentadienyl (meth)acrylate, dicyclopentanyl (meth)acrylate, dicyclopentenyl (meth)acrylate, tricyclodecanyl (meth)acrylate, isobornyl (meth)acrylate, bornyl (meth)acrylate, diacetone (meth)acrylamide, isobutoxymethyl (meth)acrylamide, N-vinylpyrrolidone, N-vinylcaprolactam, N,N-dimethyl (meth)acrylamide, tert-octyl (meth)acrylamide, dimethylaminoethyl (meth)acrylate, diethylaminoethyl (meth)acrylate, 7-amino-3,7-dimethyloctyl (meth)acrylate, dimethyl maleate, diethyl maleate, dimethyl fumarate, diethyl fumarate, 2-hydroxyethyl methacrylate, ethylene glycol monomethyl ether (meth)acrylate, ethylene glycol monoethyl ether (meth)acrylate, glycerol (meth)acrylate, acrylic amide, methacrylic amide, (meth)acrylonitrile, methyl (meth)acrylate, ethyl (meth)acrylate, isobutyl (meth)acrylate and 2-ethylhexyl (meth)acrylate.

Exemplary polyfunctional compounds include trimethylolpropane tri(meth)acrylate, pentaerythritol tri(meth)acrylate, ethylene glycol di(meth)acrylate, tetraethylene glycol di(meth)acrylate, polyethylene glycol di(meth)acrylate, 1,4-butanediol di(meth)acrylate, butylene glycol di(meth)acrylate, propylene glycol di(meth)acrylate, trimethylolpropane di(meth)acrylate, 1,6-hexanediol di(meth)acrylate, neopentyl glycol di(meth)acrylate, trimethylolpropane tri(meth)acrylate, tris(2-hydroxyethyl)isocyanurate tri(meth)acrylate, tris(2-hydroxyethyl)isocyanurate di(meth)acrylate, tricyclodecanedimethanol di(meth)acrylate, epoxy (meth)acrylate obtained by adding a (meth)acrylic acid to diglycidyl ether of bisphenol A, bisphenol A-di(meth)acryloyloxyethyl ether, bisphenol A-di(meth)acryloyloxy ethyloxy ethyl ether, bisphenol A-di(meth)acryloyloxyloxy methyl ethyl ether, tetramethylolpropane tetra(meth)acrylate, pentaerythritol tri(meth)acrylate, pentaerythritol tetra(meth)acrylate, dipentaerythritol pent(meth)acrylate and dipentaerythritol hexa(meth)acrylate.

A commercially available ethylenically unsaturated compound can be used as the ethylenically unsaturated compound (B). Examples (trade names) include ARONIX series M-210, M-309, M-310, M-400, M-7100, M-8030, M-8060, M-8100, M-9050, M-240, M-245, M-6100, M-6200, M-6250, M-6300, M-6400 and M-6500 (available from Toagosei Co., Ltd.); KAYARAD series R-551, R-712, TMPTA, HDDA, TPGDA, PEG400DA, MANDA, HX-220, HX-620, R-604, DPCA-20, DPCA-30, DPCA-60 and DPCA-120 (available from Nippon Kayaku Co., Ltd.); and Biscoat series Nos. 295, 300, 260, 312, 335HP, 360, GPT, 3PA and 400 (available from Osaka Organic Chemical Industry Ltd.).

These ethylenically unsaturated compounds (B) may be used singly or in combination of two or more kinds. Preferably, the ethylenically unsaturated compound (B) is used in an amount of 10 to 250 parts by weight, more preferably 10 to 150 parts by weight, and particularly preferably 10 to 100 parts by weight based on 100 parts by weight of the alkali soluble resin (A). When the amount falls below the lower limit, the radiation-sensitivity of the resin composition tends to be lowered. On the other hand, when the amount exceeds the upper limit, a compatibility of the compound (B) with the alkali soluble resin (A) may be lowered; the storage stability may be lowered; and it may be difficult to obtain a film in a thickness of 20 μm or more.

Radiation-Induced Radical Polymerization Initiator (C)

Examples of the radiation-induced radical polymerization initiator (C) for use in the invention include:

α-diketones, such as benzyl and diacetyl;

acyloins, such as benzoin;

acyloin ethers, such as benzoin methyl ether, benzoin ethyl ether and benzoin isopropyl ether;

benzophenones, such as thioxanthone, 2,4-diethyl thioxanthone, thioxanthone-4-sulfonic acid, benzophenone, 4,4'-bis(dimethylamino)benzophenone and 4,4'-bis(diethylamino)benzophenone;

acetophenones, such as acetophenone, p-dimethylaminoacetophenone, α,α-dimethoxy-α-acetoxybenzophenone, α,α-dimethoxy-α-phenylacetophenone, p-methoxyacetophenone, 1-[2-methyl-4-methylthiophenyl]-2-morpholino-1-propanone, α,α-dimethoxy-α-morpholino-methylthiophenyl acetophenone and 2-benzyl-2-dimethylamino-1-(4-morpholinophenyl)-butane-1-one;

quinones, such as anthraquinone and 1,4-naphthoquinone;

halides, such as phenacyl chloride, tribromomethylphenylsulfone and tris(trichloromethyl)-s-triazine;

bisimidazoles, such as [1,2'-bisimidazol]-3,3',4,4'-tetraphenyl and [1,2'-bisimidazol]-1,2'-dichlorophenyl-,3',4,4'-tetraphenyl;

peroxides, such as di-tert-butyl peroxide; and acylphosphine oxides, such as 2,4,6-trimethylbenzoyldiphenylphosphine oxide.

Commercial products of the radical polymerization initiator include IRGACURE series 184, 651, 500, 907, CGI369 and CG24-61 (trade names, available from Ciba Specialty Chemicals Inc.); LUCIRIN LR8728 and LUCIRIN TPO (trade names, available from BASF); DAROCUR series 1116 and 1173 (trade names, available from Ciba Specialty Chemicals Inc.); and UBECRYL P36 (trade name, available from UCB).

When necessary, the above radiation-induced radical polymerization initiator may be used in combination with a hydrogen donor compound, such as mercaptobenzothiazole or mercaptobenzoxazole.

Of the listed radiation radical polymerization initiators (C), preferable are the acetophenones such as 1-[2-methyl-4-methylthiophenyl]-2-morpholino-1-propanone, 2-benzyl-2-dimethylamino-1-(4-morpholinophenyl)-butane-1-one and α,α-dimethoxy-α-phenylacetophenone; phenacyl chloride and tribromomethylphenylsulfone; 2,4,6-trimethylbenzoyldiphenylphosphine oxide; combinations of the 1,2'-bisimidazoles and 4,4'-bis(diethylamino)benzophenone and mercaptobenzothiazole; LUCIRIN TPO (trade name); and IRGACURE 651 (trade name).

These radiation-induced radical polymerization initiators (C) may be used singly or in combination of two or more kinds. Preferably, the initiator (C) is used in an amount of 0.1 to 50 parts by weight, more preferably 1 to 30 parts by weight, and particularly preferably 2 to 30 parts by weight based on 100 parts by weight of the alkali soluble resin (A). When the amount is less than the lower limit, radicals are more liable to be deactivated by oxygen (and thereby the sensitivity will be lowered). Whereas the amount over the upper limit tends to cause poor compatibility and low storage stability.

The radiation-induced radical polymerization initiator (C) may be used together with a radiosensitizer.

Other Components

In the invention, it is possible that solvents and various additives be optionally used in addition to the alkali soluble resin (A), the ethylenically unsaturated compound (B) and the radiation-induced radical polymerization initiator (C).

(Solvent)

A solvent for use herein can be an organic solvent that can homogeneously dissolve the alkali soluble resin (A) and the other components and that does not react with these components. This organic solvent can be the same polymerization solvent as in the production of the alkali soluble resin (A). Further, a high boiling solvent may be added. Exemplary high boiling solvents are N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

Of the above organic solvents, the followings are suitable from the viewpoint of the solubility of the components, reactivity with the components and film formability from the resultant solution:

alkylethers of polyvalent alcohols, such as ethylene glycol monoethyl ether and diethylene glycol monomethyl ether;

alkyl ether acetates of polyvalent alcohols, such as ethyl cellosolve acetate and propylene glycol monomethyl ether acetate;

esters, such as ethyl 3-ethoxypropionate, methyl 3-methoxypropionate and ethyl 2-hydroxypropionate; and ketones, such as diacetone alcohol.

The amount of the solvent can be determined in accordance with the purpose of the resin composition and the application method.

(Thermal Polymerization Inhibitor)

A thermal polymerization inhibitor may be added to the radiation-sensitive resin composition. Exemplary thermal polymerization inhibitors include pyrogallol, benzoquinone, hydroquinone, methylene blue, tert-butylcatechol, monobenzyl ether, methylhydroquinone, amylquinone, amyloxyhydroquinone, n-butylphenol, phenol, hydroquinone monopropylether, 4,4'-(1-methylethylidene)bis(2-methylphenol), 4,4'-(1-methylethylidene)bis(2,6-dimethylphenol), 4,4'-[1-[4-(1-(4-hydroxyphenyl)-1-methylethyl)phenyl] ethylidene]bisphenol, 4,4',4''-ethylidene tris(2-methylphenol), 4,4',4''-ethylidene trisphenol and 1,1,3-tris (2,5-dimethyl-4-hydroxyphenyl)-3-phenylpropane.

The amount of the thermal polymerization inhibitor is preferably not more than 5 parts by weight based on 100 parts by weight of the alkali soluble resin (A).

(Surfactant)

A surfactant may be added to the radiation-sensitive resin composition in order to improve application, antifoaming and leveling properties of the resin composition. Suitable examples include fluorine-based surfactants, such as commercial products such as BM-1000 and BM-1100 (available from BM Chemie); MEGAFACE series F142D, F172, F173 and F183 (available from Dainippon Ink and Chemicals, Incorporated); FLUORAD series FC-135, FC-170C, FC-430 and FC-431 (available from Sumitomo 3M); SURFLON series S-112, S-113, S-131, S-141 and S-145 (available from Asahi Glass Co., Ltd.); and SH-28PA, SH-190, SH-193, SZ-6032 and SF-8428 (available from Toray Dow Corning Silicone Co., Ltd.).

The amount of the surfactant is preferably not more than 5 parts by weight based on 100 parts by weight of the alkali soluble resin (A).

(Adhesion Improver)

An adhesion improver may be used to enhance the adhesion between the radiation-sensitive resin composition and a substrate. For this purpose, a functional silane coupling agent is effective. Here, the functional silane coupling agent refers to a silane coupling agent that has a reactive substituent such as a carboxyl, methacryloyl, isocyanate or epoxy group. Specific examples include trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycyclohexyl)ethyltrimethoxysilane.

The amount of the adhesion improver is preferably not more than 5 parts by weight based on 100 parts by weight of the alkali soluble resin (A).

(Acid)

An acid may be added to the radiation-sensitive resin composition for the purpose of fine adjustment of the solubility in alkaline developer. Exemplary acids include:

monocarboxylic acids, such as acetic acid, propionic acid, n-butyric acid, iso-butyric acid, n-valeric acid, iso-valeric acid, benzoic acid and cinnamic acid;

hydroxymonocarboxylic acids, such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringinic acid;

polyvalent carboxylic acids, such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid and 1,2,5,8-naphthalenetetracarboxylic acid; and acid anhydrides, such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic dianhydride, cyclopentanetetracarboxylic dianhydride, phthalic anhydride, pyromellitic anhydride, trimellitic anhydride, benzophenonetetracarboxylic anhydride, ethylene glycol bis (trimellitate anhydride) and glycerin tris(trimellitate anhydride).

(Filler, Colorant and Viscosity Modifier)

Further, a filler, a colorant and a viscosity modifier may be optionally added to the radiation-sensitive resin composition.

Exemplary fillers include silica, alumina, talc, bentonite, zirconium silicate and glass powder.

Exemplary colorants include:

extender pigments, such as alumina white, clay, barium carbonate and barium sulfate;

inorganic pigments, such as zinc oxide, white lead, chrome yellow, red lead, ultramarine, iron blue, titanium oxide, zinc chromate, colcothar and carbon blacks;

organic pigments, such as brilliant carmine 6B, permanent red 6B, permanent red R, benzidine yellow, phthalocyanine blue and phthalocyanine green;

basic dyes, such as magenta and rhodamine;

direct dyes, such as Direct Scarlet and Direct Orange; and acid dyes, such as rhocerin and metanil yellow.

Exemplary viscosity modifiers include bentonite, silica gel and aluminum powder.

These additives are added in amounts that do not lead to any detrimental effects on the intrinsic properties of the resin composition. Preferably, the amount is not more than 50 wt % based on the amount of the resin composition.

Preparation of the Radiation-Sensitive Resin Composition

The radiation-sensitive resin composition of the invention can be prepared as follows. When the filler and pigment are not used, it is sufficient to mix together and stir the components (A), (B) and (C) and optionally other components by a known method. When using the filler and the pigment, all the components can be mixed and dispersed with a dispersion mixer, such as a dissolver, a homogenizer or a three-roll mill. When necessary, the components or the obtained composition may be filtered through a mesh or a membrane filter.

Use of the Radiation-Sensitive Resin Composition

The radiation-sensitive resin composition as described above can be used in the form of solution directly or in the form of dry film. In the dry film method, the resin composition is spread onto a flexible base film and dried to give a radiation-sensitive film (photosensitive layer), which is thereafter attached onto a substrate. In the case of the dry film method, the photosensitive layer formed on a base film is preferably laminated with a cover film to be stored before use.

Suitable base films for the dry film include synthetic resin films, such as of polyethylene terephthalate (PET), polyethylene, polypropylene, polycarbonate, polyethersulfone and polyvinyl chloride. The base film preferably has a thickness of 15 to 125 μm.

The photosensitive layer can be produced with use of, for example, an applicator, a bar coater, a roll coater, a curtain flow coater, a die coater, a spin coater or a screen printer. The dry thickness of the layer is preferably between 10 and 150 μm.

The cover film for the dry film is for the purpose of stable protection of the photosensitive layer before use and is removed at use. Therefore, the cover film is required to have a proper release properties whereby it does not come off before use but can be easily released at the time of use. The cover films satisfying this condition are a PET film, a polypropylene film, a polyethylene film and so forth. Also, these films which are coated with silicone or on which silicone is baked may be used. The cover film ranges in thickness from about 15 to 100 μm.

The cover film has an oxygen impermeability, whereby adverse effects by oxygen during photoexposure can be prevented.

A photomask used for patterning adheres to the photosensitive layer during photoexposure. To avoid sticking of the photomask to the photosensitive layer, a layer of a water-soluble resin composition may be formed on the photosensitive layer. In this case, the cover film is laminated on the layer of water-soluble resin composition and the dry film is stored as such. The layer of water-soluble resin composition can be prepared by application of an aqueous solution of 5 to 20 wt % polyvinyl alcohol or partially saponified polyvinyl acetate, followed by drying, so that the layer is obtained in a dry thickness of 1 to 10 μm. Further, it is possible to add ethylene glycol, propylene glycol or polyethylene glycol to the aqueous solution of water-soluble resin composition. In preparing the aqueous solution, a solvent, such as methanol, ethylene glycol monomethyl ether or acetone; or a commercial water-soluble antifoaming agent, may be added for the purpose of viscosity control and antifoaming effects.

A metal pattern is formed using the radiation-sensitive resin according to a conventional method. For example, the resin composition is applied onto a workpiece surface;

the resultant film is patterned by photolithography; and a chemical etching or an electroforming technique, mainly comprising an electrolytic etching and an electroplating, or their combination is carried out using the patterned film as a mask.

A semiconductor device can be manufactured with a conventional technique using a metal pattern formed by the above method.

Hereinbelow, the methods for forming the film (photosensitive layer) and for treating the film will be explained in more detail.

1. Method of Film Formation 1-1 Application of the Liquid Resin Composition

The solution of the radiation-sensitive resin composition is applied onto a given substrate and heated to remove the solvent. Thus, a desired film is prepared. The application can be performed by spin coating, roll coating or screen process printing, or by use of an applicator. Drying conditions for the applied resin composition vary depending on the kinds and proportions of the components making up the resin composition and the coating thickness. Generally, the drying is carried out at 60 to 160° C., and preferably 80 to 150° C., for 3 to 15 minutes. When a drying time is too short, adhesion may be bad at the time of development; whereas overlong drying causes an excessive thermal change that leads to lowering of the resolution.

In the case where a substrate coated with the resin composition is plated to form a bump or a wiring, it is requisite that the surface of the substrate has been coated with metal in advance of application of the resin composition. The metal coating method for the substrate of the invention is not particularly limited. For example, the substrate surface can be coated with a metal by deposition or sputtering.

2. Irradiation

The above-obtained film is exposed to radiation, for example ultraviolet rays or visible rays with 300 to 500 nm wavelength, through a photomask having a desired pattern. As a result, an exposed area, which is one other than an area for forming a bump or a wiring, is hardened. Usable radiations include ultraviolet rays, visible rays, far ultraviolet rays, X-rays and electron beams. Exemplary radiation sources are low-pressure, high-pressure and super-high-pressure mercury lamps, metal halide lamps and argon gas lasers. The dose varies depending on the kinds and proportions of the components making up the resin composition and the film thickness; for example, it is in the range of 100 to 1500 mJ/cm$^2$ in the case of high-pressure mercury lamps.

3. Development

After the irradiation, development is carried out using an alkaline aqueous solution as a developer. In the development, an unnecessary non-exposed area is dissolved by the developer and removed while an exposed area is left. Thus, a cured film in desired pattern is obtained. Exemplary developers include alkaline aqueous solutions of sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene and 1,5-diazabicyclo[4.3.0]-5-nonane.

The alkaline aqueous solution may be mixed with an appropriate amount of water-soluble organic solvent, such as methanol or ethanol, or a surfactant.

The developing time varies depending on the kinds and proportions of the components making up the resin composition and the film thickness; for example, it is usually in the range of 30 to 360 seconds.

The developing method may be any of paddling, dipping, paddling, spraying and showering of the developer. After the development, the patterned film is washed under running water for 30 to 90 seconds and thereafter dried by use of an air gun or with heating by a hot plate or an oven.

4. Post Treatment

Although the film obtained from the resin composition can be sufficiently cured by the above irradiation, additional irradiation (hereinafter referred to as the "post irradiation") or heating may be performed to further cure the film. The post irradiation may be carried out by a similar method to that of the first irradiation. The dose is not particularly limited, but is preferably in the range of 100 to 2000 mJ/cm$^2$ in the case of high-pressure mercury lamps. When heating is performed, a heating apparatus such as a hot plate or an oven can be used. The heat treatment can be carried out at a given temperature, e.g. 60 to 100° C., for a given time, e.g. 5 to 30 minutes on a hot plate or 5 to 60 minutes in an oven. Through the post treatment, the cured film with a desired pattern can have further improved properties.

5. Plating

The post-treated substrate is immersed in a plating solution for electroplating and electroplated under conditions of a current and an electric conduction time that have been set for obtaining a desired deposit thickness.

6. Stripping

Next, the cured film of the invention is stripped from the plated substrate by, for example, immersing the substrate for 5 to 30 minutes in a stripping solution at 30 to 80° C. with agitation. Examples of the stripping solutions include an aqueous solution of quaternary ammonium salt and a mixed solution of quaternary ammonium salt, dimethyl sulfoxide and water. The stripping treatment may be also conducted by spraying, showering or paddling the substrate with a similar stripping solution.

EXAMPLES

The present invention will be hereinafter described in detail by the following Examples, but it should be construed that the invention is in no way limited to those Examples. Hereinafter, "parts" and "%" are "parts by weight" and "wt %" respectively unless otherwise mentioned.

Synthesis Example 1

Synthesis of Alkali Soluble Resin (A-1)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

5 g of acrylic acid;

7 g of methacrylic acid;

35 g of α-methyl-p-hydroxystyrene;

24 g of isobornyl acrylate; and 29 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 3 g of glycidyl methacrylate, 0.1 g of p-methoxyphenol and 0.3 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain an alkali soluble resin (A-1) in the form of resin solution.

Synthesis Example 2

Synthesis of Alkali Soluble Resin (A-2)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

5 g of acrylic acid;

7 g of methacrylic acid;

35 g of α-methyl-p-hydroxystyrene;

24 g of isobornyl acrylate; and 29 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 10 g of glycidyl methacrylate, 0.33 g of p-methoxyphenol and 11.0 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain an alkali soluble resin (A-2) in the form of resin solution.

Synthesis Example 3

Synthesis of Alkali Soluble Resin (A-3)

A flask equipped with a reflux condenser was purged with nitrogen. Thereafter, the following materials were placed into the flask:

3.0 g of 2,2'-azobisisobutyronitrile (polymerization initiator);
150 g of ethyl lactate (solvent);
5 g of acrylic acid;
7 g of methacrylic acid;
35 g of α-methyl-p-hydroxystyrene;
24 g of styrene; and
29 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 3 g of glycidyl methacrylate, 0.1 g of p-methoxyphenol and 0.3 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain an alkali soluble resin (A-3) in the form of resin solution.

Synthesis Example 4

Synthesis of Alkali Soluble Resin (A-4)

A flask equipped with a reflux condenser was purged with nitrogen. Thereafter, the following materials were placed into the flask:

3.0 g of 2,2'-azobisisobutyronitrile (polymerization initiator);
150 g of ethyl lactate (solvent);
12 g of acrylic acid;
6 g of methacrylic acid;
35 g of α-methyl-p-hydroxystyrene;
15 g of styrene; and
32 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 5 g of glycidyl methacrylate, 0.17 g of p-methoxyphenol and 0.5 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain an alkali soluble resin (A-4) in the form of resin solution.

Synthesis Example 5

Synthesis of Alkali Soluble Resin (A-5)

A flask equipped with a reflux condenser was purged with nitrogen. Thereafter, the following materials were placed into the flask:

3.0 g of 2,2'-azobisisobutyronitrile (polymerization initiator);
150 g of ethyl lactate (solvent);
30 g of acrylic acid;
10 g of α-methyl-p-hydroxystyrene;
20 g of isobornyl acrylate; and
30 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 15 g of glycidyl methacrylate, 0.5 g of p-methoxyphenol and 1.5 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain an alkali soluble resin (A-5) in the form of resin solution.

Synthesis Example 6

Synthesis of Copolymer (A-6)

A flask equipped with a reflux condenser was purged with nitrogen. Thereafter, the following materials were placed into the flask:

3.0 g of 2,2'-azobisisobutyronitrile (polymerization initiator);
150 g of ethyl lactate (solvent);
35 g of α-methyl-p-hydroxystyrene;
24 g of isobornyl acrylate; and
41 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 10 g of glycidyl methacrylate, 0.33 g of p-methoxyphenol and 11.0 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain a copolymer (A-6) in the form of resin solution.

Synthesis Example 7

Synthesis of Copolymer (A-7)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

30 g of acrylic acid;

25 g of methacrylic acid;

10 g of α-methyl-p-hydroxystyrene;

15 g of isobornyl acrylate; and 20 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 1 g of glycidyl methacrylate, 0.03 g of p-methoxyphenol and 0.1 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain a copolymer (A-7) in the form of resin solution.

Synthesis Example 8

Synthesis of Copolymer (A-8)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

15 g of acrylic acid;

20 g of methacrylic acid;

10 g of styrene;

25 g of isobornyl acrylate; and 30 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C.

After the completion of the reaction, the solution was cooled to room temperature. To the solution, 5 g of glycidyl methacrylate, 0.17 g of p-methoxyphenol and 0.5 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain a copolymer (A-8) in the form of resin solution.

Synthesis Example 9

Synthesis of Copolymer (A-9)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

15 g of acrylic acid;

55 g of α-methyl-p-hydroxystyrene;

10 g of isobornyl acrylate; and 20 g of n-butyl acrylate.

Then the contents were stirred until the solids dissolved completely. After the complete dissolution, the solution was heated to 80° C., and polymerization was carried out at this temperature for 7 hours. Further, polymerization was carried out for 1 hour at the solution temperature of 100° C. to yield a solution that contained a copolymer.

After the completion of the reaction, the solution was cooled to room temperature. To the solution, 5 g of glycidyl methacrylate, 0.17 g of p-methoxyphenol and 0.5 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain a copolymer (A-9) in the form of resin solution.

Synthesis Example 10

Synthesis of Copolymer (A-10)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

5 g of acrylic acid;

7 g of methacrylic acid;

36 g of α-methyl-p-hydroxystyrene;

23 g of isobornyl acrylate; and 20 g of n-butyl acrylate.

Then the contents were stirred until the solids dissolved completely. After the complete dissolution, the solution was heated to 80° C., and polymerization was carried out at this temperature for 7 hours. Further polymerization was carried out for 1 hour at the solution temperature of 100° C. Thereafter, the solution was cooled to room temperature to obtain a copolymer (A-10) in the form of resin solution.

Synthesis Example 11

Synthesis of Copolymer (A-11)

A flask equipped with a reflux condenser was purged with nitrogen. Thereafter, the following materials were placed into the flask:

3.0 g of 2,2'-azobisisobutyronitrile (polymerization initiator);

150 g of ethyl lactate (solvent);

10 g of acrylic acid;

18 g of methacrylic acid;

20 g of α-methyl-p-hydroxystyrene;

23 g of isobornyl acrylate; and
29 g of n-butyl acrylate.

Then the contents were stirred until the solids dissolved completely. After the complete dissolution, the solution was heated to 80° C., and polymerization was carried out at the temperature for 7 hours. Further, polymerization was carried out for 1 hour at the solution temperature of 100° C. to yield a solution that contained a copolymer.

After the completion of the reaction, the solution was cooled to room temperature. To the solution, 25 g of glycidyl methacrylate, 0.83 g of p-methoxyphenol and 2.5 g of tetrabutylammonium bromide were added. The mixture was stirred until these added compounds dissolved completely. The solution thus obtained was heated to 80° C., and an addition reaction was allowed to take place for 16 hours between the carboxyl group in the copolymer and the epoxy group in the glycidyl methacrylate. Thereafter, the solution was cooled to room temperature to obtain a copolymer (A-11) in the form of resin solution.

Data on the copolymers synthesized above is arranged in Table 1. The degree of conversion of every copolymer (I), which was reacted with the radically polymerizable compound having an epoxy group, is shown in Table 1. The molecular weight of every alkali soluble resin (A) obtained after the polymerization is also shown in Table 1.

The contents were stirred until the above components dissolved completely. Thus, radiation-sensitive resin compositions were produced.

The components (A), (B) and (C) used in Examples and Comparative Examples are listed in detail in Table 2.

For the resin compositions thus obtained, the following properties were measured as described. The results are given in Table 3.

(Evaluation of Properties)

(1) Resolution and Film Retention

Cr and Au layers were in this order sputtered on a silicon wafer to prepare a substrate. The radiation-sensitive resin composition was applied by a spinner onto the substrate. The applied resin composition was prebaked on a 100° C. hot plate for 5 minutes to form a film of a thickness of 25 μm. Subsequently, the film was irradiated through a pattern mask for the resolution measurement with ultraviolet rays in 600 mJ/cm$^2$ dose by the use of super-high-pressure mercury lamp HBO-1000W/D (available from Mitsubishi Electric Osram Ltd.). The irradiation was followed by development using an aqueous solution of 0.5% tetramethylammonium hydroxide. The developed product was washed under running water and spin-dried to give a patterned cured-film. The patterned film was observed with a scanning electron micro-

TABLE 1

|  | a |  | b | c |  |  | d | Copolymer (I) Degree of conversion | Alkali soluble resin (A) Weight-average molecular weight |
|---|---|---|---|---|---|---|---|---|---|
|  | AA | MA | PIPE | St | IBXA | n-BA | GMA |  |  |
| Synthesis Ex. 1 | 5 | 7 | 35 | — | 24 | 29 | 3 | 99% | 12,000 |
| Synthesis Ex. 2 | 5 | 7 | 35 | — | 24 | 29 | 10 | 99% | 12,500 |
| Synthesis Ex. 3 | 5 | 7 | 35 | 24 | — | 29 | 3 | 99% | 9,500 |
| Synthesis Ex. 4 | 12 | 6 | 35 | 15 | — | 32 | 5 | 100% | 14,200 |
| Synthesis Ex. 5 | 30 | — | 10 | — | 20 | 30 | 15 | 100% | 16,300 |
| Synthesis Ex. 6 | — | — | 35 | — | 24 | 41 | 10 | 99% | 13,200 |
| Synthesis Ex. 7 | 30 | 25 | 10 | — | 15 | 20 | 1 | 99% | 17,600 |
| Synthesis Ex. 8 | 15 | 20 | — | 10 | 25 | 30 | 5 | 100% | 24,300 |
| Synthesis Ex. 9 | 15 | — | 55 | — | 10 | 20 | 5 | 87% | 8,700 |
| Synthesis Ex. 10 | 5 | 7 | 36 | — | 23 | 20 | — | 99% | 11,400 |
| Synthesis Ex. 11 | 10 | 18 | 20 | — | 23 | 29 | 25 | 100% | 13,700 |

AA: acrylic acid,
MA: methacrylic acid,
PIPE: α-methyl-p-hydroxystyrene,
St: styrene
IBXA: isobornyl acrylate,
n-BA: n-butyl acrylate,
GMA: glycidyl methacrylate

EXAMPLES AND COMPARATIVE EXAMPLES 100 parts of each alkali soluble resin (A), prepared in the above Synthesis Examples, was dissolved in 100 parts of ethyl lactate as a solvent. To the resultant solutions were further added:

as the radiation radical polymerization initiators (C), 20 parts of 2,4,6-trimethylbenzoyldiphenylphosphine oxide (LUCIRIN TPO (trade name) available from BASF) and 10 parts of IRGACURE 651 (trade name, available from Ciba Specialty Chemicals Inc.);

the ethylenically unsaturated compound (B) specified in Table 2 in the amount shown in Table 2; and as a surfactant, 0.3 part of NBX-15 (trade name, available from Neos Co., Ltd.).

scope to evaluate the resolution. The resolution was evaluated as either "A" when a pattern of 15×75 μm rectangles had been resolved or "B" for other unsuccessful cases.

The film retention was determined by measuring a film thickness after the development. The film retention was obtained by dividing the developed film thickness with the prebaked film thickness, and multiplying the quotient by 100. The film retention was evaluated as "AA" for 95% or more, "A" for 90% or more, and "B" for less than 90%.

(2) Evaluation of Wettability by and Resistance to Plating Solution

The substrate having the patterned film, which was obtained in the above (1), was electroplated at 5 mA/dm$^2$ and 60° C. for 50 minutes using TEMPERESIST EX (available from Japan Pure Chemical Co., Ltd.) as a gold cyanide plating solution. Thereafter, the substrate was immersed in stripping solution THB-S2 (available from JSR) at 70° C. for 5 minutes with agitation. After the patterned film was thus stripped, the substrate was observed with a light microscope to evaluate the wettability by plating solution. The wettability was evaluated as either "A" when 15×75 μm deposits had been formed as designed with the patterned film or "B" when a deletion of the deposits was found.

Moreover, the substrate was observed with a scanning electron microscope for gold deposits in an area that should have been protected by the resist pattern. The plating resistance was evaluated as either "A" when no such undesired gold deposition was detected or "B" when it was found.

(3) Stripping Properties

The substrate obtained in the above (2) was observed with a scanning electron microscope to determine the presence or absence of residual patterned film in the deposited area. The stripping properties were evaluated as either "A" for the absence and "B" for the presence of residuals.

to 9 showed excellent suitability for thick film production and yielded films having good resolution, plating resistance and stripping properties. Consequently, a beautiful pattern of deposits was produced in every Example. On the other hand, Comparative Examples 1 to 6, where the alkali soluble resin having an unsaturated group was used in an amount outside the range according to the invention, afforded compositions which yielded films having poor resolution, insufficient plating resistance and inadequate stripping properties.

INDUSTRIAL APPLICABILITY

The invention provides a radiation-sensitive resin composition excellent in alkali developability, plating resistance and stripping properties. The resin composition has a high resolution whereby the resultant film in a thickness of 20 μm or more can be patterned at 25 μm pitches in the production

TABLE 2

| | Alkali soluble resin (A) | Ethylenically unsaturated compound (B) | Radiation-induced radical polymerization initiator (C) |
| --- | --- | --- | --- |
| Ex. 1 | alkali soluble resin (A-1) | M8060 40 parts | L-TPO/I-651 = 20/10 |
| Ex. 2 | | M8060 50 parts | |
| Ex. 3 | | M8060 60 parts | |
| Ex. 4 | | DPHA 40 parts | |
| Ex. 5 | | PETA 50 parts | |
| Ex. 6 | alkali soluble resin (A-2) | M8060 25 parts | |
| Ex. 7 | alkali soluble resin (A-3) | M8060 50 parts | |
| Ex. 8 | alkali soluble resin (A-4) | M8060 40 parts | |
| Ex. 9 | alkali soluble resin (A-5) | M8060 25 parts | |
| Comp. Ex. 1 | copolymer (A-6) | M8060 25 parts | |
| Comp. Ex. 2 | copolymer (A-7) | M8060 60 parts | |
| Comp. Ex. 3 | copolymer (A-8) | M8060 50 parts | |
| Comp. Ex. 4 | copolymer (A-9) | M8060 50 parts | |
| Comp. Ex. 5 | copolymer (A-10) | M8060 60 parts | |
| Comp. Ex. 6 | copolymer (A-11) | M8060 25 parts | |

M8060: ARONIX M8060 (trade name, available from Toagosei Co., Ltd.)
DPHA: LIGHT-ACRYLATE DPE-6A (trade name, available from Kyoeisya Chemical Co., Ltd.)
PETA: Biscoat No. 300 (trade name, available from Osaka Organic Chemical Industry)
L-TPO: LUCIRIN TPO (trade name, available from BASF)
I-651: IRGACURE 651 (trade name, available from Ciba Specialty Chemicals Inc.)

TABLE 3

| | Resolution | Film retention | Wettability by plating solution | Plating resistance | Stripping properties |
| --- | --- | --- | --- | --- | --- |
| Ex. 1 | A | A | A | A | A |
| Ex. 2 | A | A | A | A | A |
| Ex. 3 | A | A | A | A | A |
| Ex. 4 | A | A | A | A | A |
| Ex. 5 | A | A | A | A | A |
| Ex. 6 | A | A | A | A | A |
| Ex. 7 | A | A | A | A | A |
| Ex. 8 | A | A | A | A | A |
| Ex. 9 | A | A | A | A | A |
| Comp. Ex. 1 | B | a) | — | — | — |
| Comp. Ex. 2 | B | B | A | B | A |
| Comp. Ex. 3 | B | A | A | A | B |
| Comp. Ex. 4 | B | B | A | B | A |
| Comp. Ex. 5 | B | B | A | B | A |
| Comp. Ex. 6 | B | A | A | A | B | a): patterning impossible

As shown in Table 3, the radiation-sensitive resin compositions according to the invention obtained in Examples 1 of gold bumps or whereby the resultant film in a thickness of 10 μm can be patterned at 5 μm pitches in the formation of wirings.

What is claimed is:

1. A radiation-sensitive resin composition, comprising:
(A) an alkali-soluble resin having an unsaturated group,
(B) a compound having at least one ethylenically unsaturated double bond, and
(C) a radiation-induced radical polymerization initiator, wherein:
the alkali-soluble resin having an unsaturated group (A) is obtained by reacting:
(I) 100 parts by weight of a copolymer having a carboxyl group comprising
1 to 40 wt % structural units having a carboxyl group which are derived from (a) a radically polymerizable compound having a carboxyl group, and
1 to 50 wt % structural units having a phenolic hydroxyl group which are derived from (b-1) a radically polymerizable compound having a phenolic hydroxyl group or (b-2) a radically polymerizable compound having a functional group convertible into a phenolic hydroxyl group after the copolymerization, other structural units of said copolymer being derived from (c) a radically polymerizable compound other than the compounds (a), (b-1), (b-2) and the following compound (d);

with (II) 0.1 to 5 parts by weight of (d) a radically polymerizable compound having an epoxy group which is selected from the group consisting of glycidyl (meth)acrylate, glycidyl α-ethyl (meth)acrylate, glycidyl α-n-propyl (meth)acrylate, glycidyl α-n-butyl (meth)acrylate, 3,4-epoxybutyl (meth)acrylate, 6,7-epoxyheptyl (meth)acrylate and cyclohexene oxide (meth)acrylate.

2. The radiation-sensitive resin composition as claimed in claim 1, wherein the radically polymerizable compound (b-1) is α-methyl-p-hydroxystyrene.

3. A method of producing a metal pattern, comprising:
applying the radiation-sensitive resin composition as claimed in claim 1 or 2 onto a substrate to form a film,
exposing the film to radiation through a photomask having a desired pattern to harden an exposed area,
dissolving a non-exposed area by development to form a cured film in said desired pattern,
plating the substrate having the cured film in said desired pattern, and stripping the cured film.

4. A method of producing a semiconductor device, comprising:
forming a metal pattern by
applying the radiation-sensitive resin composition as claimed in claim 1 or 2 onto a substrate to form a film,
exposing the film to radiation through a photomask having a desired pattern to harden an exposed area,
dissolving a non-exposed area by development to form a cured film in said desired pattern,
plating the substrate having the cured film in said desired pattern, and stripping the cured film.

5. A method of producing a metal pattern, using the radiation-sensitive resin composition as claimed in claim 2.

6. A method of producing a semiconductor device, using a metal pattern formed by the method as claimed in claim 5.

7. The radiation-sensitive resin composition as claimed in claim 1, wherein said component (a) is acrylic acid, methacrylic acid, phthalic acid monohydroxyethyl acrylate or 2-hexahydrophthaloylethyl methacrylate.

8. The radiation-sensitive resin composition as claimed in claim 1, wherein said component (b-1) is p-hydroxystyrene.

9. The radiation-sensitive resin composition as claimed in claim 1, wherein said component (b-2) is p-acetoxystyrene, α-methyl-p-acetoxystyrene, p-benzyloxystyrene, p-tert-butoxystyrene, p-tert-butoxycarbonyloxystyrene or p-tert-butyldimethylsiloxystyrene.

10. The radiation-sensitive resin composition as claimed in claim 1, wherein said component (c) is aryl (meth)acrylates, dicarboxylic acid diesters, polymerizable compounds having a nitrile group, polymerizable compounds having an amide linkage, vinyls, allyls, polymerizable compounds containing chlorine, conjugated diolefins or mixtures thereof.

11. The radiation-sensitive resin composition as claimed in claim 1, comprising 10 to 250 parts by weight of component (B) based on 100 parts by weight of component (A).

12. The radiation-sensitive resin composition as claimed in claim 1, comprising 0.1 to 50 parts by weight of component (C) based on 100 parts by weight of the alkali soluble resin (A).

13. The radiation-sensitive resin composition as claimed in claim 1, further comprising a solvent.

14. The radiation-sensitive resin composition as claimed in claim 1, further comprising a thermal polymerization inhibitor.

15. The radiation-sensitive resin composition as claimed in claim 1, further comprising an additive selected from the group consisting of a surfactant, an adhesion improver, an acid, a filler, a colorant, a viscosity modifier and mixtures thereof.

16. The radiation-sensitive resin composition as claimed in claim 1, which is in the form of a dry film.

17. The radiation-sensitive resin composition as claimed in claim 1, which has been exposed to radiation.

18. A radiation-sensitive resin composition, comprising:
(A) an alkali-soluble resin having an unsaturated group,
(B) a compound having at least one ethylenically unsaturated double bond, and
(C) a radiation-induced radical polymerization initiator, wherein:
the alkali-soluble resin having an unsaturated group (A) is obtained by reacting:
(I) 100 parts by weight of a copolymer having a carboxyl group comprising
1 to 40 wt % structural units having a carboxyl group which are derived from (a) a radically polymerizable compound having a carboxyl group, and
1 to 50 wt % structural units having a phenolic hydroxyl group which are derived from (b-1) a radically polymerizable compound having a phenolic hydroxyl group or (b-2) a radically polymerizable compound having a functional group convertible into a phenolic hydroxyl group after the copolymerization,
other structural units of said copolymer being derived from (c) a radically polymerizable compound other than the compounds (a), (b-1), (b-2) and the following compound (d);
with (II) 0.1 to 5 parts by weight of (d) a radically polymerizable compound having an epoxy group.

* * * * *